United States Patent [19]

Brooks et al.

[11] 3,982,189
[45] Sept. 21, 1976

[54] SQUARE WAVE TO SINE WAVE CONVERTER

[75] Inventors: William O. Brooks, Canoga Park; Clifford B. Hill, Westlake Village, both of Calif.

[73] Assignee: The United States of America as represented by the Secretary of the Navy, Washington, D.C.

[22] Filed: Nov. 25, 1975

[21] Appl. No.: 635,201

[52] U.S. Cl. .................................. 328/27; 328/22; 307/261
[51] Int. Cl.² ........................................ H03K 5/156
[58] Field of Search .................. 328/22, 27; 307/261

[56] References Cited
UNITED STATES PATENTS

| | | |
|---|---|---|
| 3,340,476 | 9/1967 | Thomas et al. .................... 328/22 X |
| 3,350,651 | 10/1967 | Davis ............................... 328/22 X |
| 3,796,960 | 3/1974 | Frizzell et al. ................... 307/261 X |
| 3,821,652 | 6/1974 | Wiebe ................................ 328/27 |
| 3,902,124 | 8/1975 | Freeborn ............................. 328/27 |
| 3,906,301 | 9/1975 | Fisher ............................ 307/261 X |

*Primary Examiner*—John S. Heyman
*Attorney, Agent, or Firm*—R. S. Sciascia; L. I. Shrago

[57] ABSTRACT

A square wave to sine wave converter of the type which utilizes an integrator, an amplifier and a sine wave shaper in the signal processing operation has an automatic gain control circuit which responds to signal variations both at the output of the integrator and the output of the amplifier to insure a constant amplitude triangular wave at the input of the sine wave shaper as the frequency of the square wave changes.

5 Claims, 1 Drawing Figure

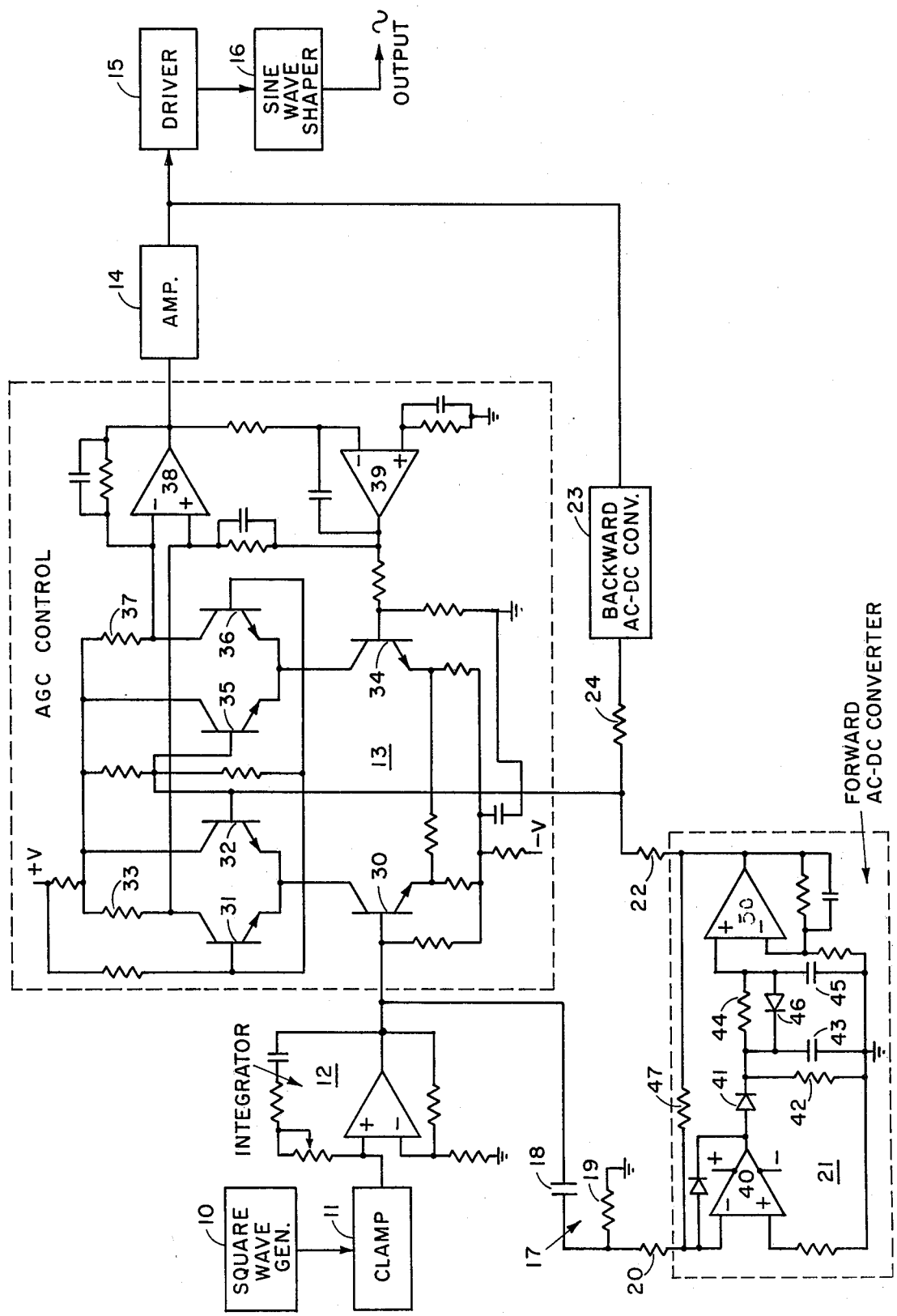

SQUARE WAVE TO SINE WAVE CONVERTER

The present invention relates generally to wave shaping circuits, and more particularly, to a square wave to sine converter which conditions a square wave input signal of uncontrollable amplitude and frequency and produces a sine wave output that exactly tracks the input signal in frequency, has constant output amplitude and has less than 2 percent harmonic distortion over a comparatively large range of input frequencies.

There are available in the prior art several circuit arrangements for producing sinusoidal wave forms from locally generated square wave forms. In one type of circuit, the square wave is locally generated, and the wave from conversion is accomplished by first integrating the square wave to obtain a triangular wave. The amplitude of this triangular wave is sampled, and any amplitude variations produce an error signal which is utilized to reset the amplitude of the square wave so as to maintain the amplitude of the triangular wave constant. The resultant constant amplitude triangular wave is thereafter applied to a sine wave shaping network made up of resistors and diodes. This technique, however, is unsatisfactory where, for example, reset control of the amplitude of the input square wave is impossible.

One of the reasons why the prior art conversion circuits cannot meet the stringent requirements mentioned above is due primarily to the characteristics of the integrator. While the conventional integrator can function over a wide band of frequencies to translate a square wave into a triangular wave, the output level does not remain constant but may drop at the rate of about 6 DB per octave. Thus, in the case where the frequency of the square wave varies over a 40 to 1 frequency range, this amplitude change may involve a factor of approximately 32.6 DB. This charateristic is important because the usual sine wave shaper which employs a resistance diode network requires a constant input for its proper operation.

In the past, this amplitude variation has been corrected by controlling the amplitude of the locally generated square wave. However, in certain applications where, for example, the square wave is derived from an external uncontrollable source, this solution is not available.

It is, accordingly, a primary object of the present invention to provide a circuit arrangement for converting an input square wave of uncontrollable amplitude and frequency to a sine wave.

Another object of the present invention is to provide a square wave to sine wave converter wherein the sine wave contains less than two percent harmonic distortion over a wide frequency band.

Another object of the present invention is to provide a square wave to sine wave converter wherein the frequency of the output sine wave exactly tracks that of the input square wave.

Another object of the present invention is to provide a square wave to sine wave converter wherein the amplitude of the output sine wave remains constant within a one percent variation as the frequency of the input square wave varies over a 40 to 1 range.

Briefly, and in somewhat general terms, the above objects of invention are accomplished by resorting to an automatic gain control circuit located between the integrator and an amplifier which feeds a driver and then a conventional sine wave shaper. The AGC circuit is controlled both by the output signal of the integrator, which acts in a forward AGC loop, and the output of the amplifier, which acts in a backward AGC loop. The DC signals developed in these loops, which do not contribute equally to the control of the AGC circuit, vary with input frequency such that an overall flat frequency response is obtained which results in a highly stabilized input signal to the wave shaper.

Referring now to the drawing, the single FIGURE of which illustrates one preferred embodiment of the invention, the square waves which are to be converted are obtained in this case from a suitable external source generator 10, which may take the form of a programmable frequency divider. In this type of generator, clock pulses, here obtained from a 2 MHz clock so as to provide the precision required, are fed to a frequency divider which counts down these clock pulses according to a prearranged schedule to arrive at the particular square wave frequency desired. The output of generator 10, which may have a 40 to 1 frequency range, is applied to a clamping circuit 11 which clamps the amplitude of the square wave to a fixed level and prevents any amplitude change from appearing in the signal supplied to wide band integrator 12. This integrator, as is well known, may consist of an operational amplifier having an appropriate capacitative element in a feedback path that may also contain a variable series resistor for linearity control. The triangular wave form developed by integrating the square wave, as mentioned hereinbefore, does not exhibit a constant amplitude as the frequency of the square wave from generator 10 changes. For example, this amplitude may drop by 6 DB in response to each doubling of the frequency of the square wave. In order to counteract this effect, the output of integrator 12 is applied to an automatic gain control circuit 13 before being fed to a follow-on amplifier 14, a driver 15 and, finally, to a conventional sine wave shaper 16.

Automatic gain control circuit 13 operates in this system as a variable attenuator to maintain the output of amplifier 14 constant within the one percent figure previously mentioned as the amplitude of the triangular wave from integrator 12 changes in response to frequency shifts in the square wave from external generator 10. The magnitude of the impedance it introduces into the signal processing operation, unlike the prior art, is determined both by the signal level at the output of integrator 12 and the signal level at the output of amplifier 14. More specifically, each of the signals appearing at these two locations develops a DC control signal in a loop circuit which contains an AC/DC converter. Both of the DC signals thus produced jointly serve to determine the amount of attenuation exhibited by the automatic gain control circuit 13. This results in a flat over-all frequency response and insures a triangular wave form of constant amplitude at the inputs of driver 15 and sine wave shaper 16.

The signal appearing at the output of integrator 12 is fed to a RC differentiator 17 consisting of series capacitor 18 and shunt resistor 19. The output of this differentiator is coupled via resistor 20 to a so-called forward AC/DC converter 21. The combined operation of these circuits such that a DC voltage of nonlinearly decreasing amplitude is produced as the frequency of the input signal is increased. More specifically, the differentiated signal is applied to the inverting terminal of a first operational amplifier 40 whichhas in its output circuit diode 41, series resistor 44, shunt resistor 42 and shunt capacitors 43 and 45. The combination of resistors and capacitors perform as a filter section to remove any ripple inthe ammplifier's output and produce an almost pure DC signal at the input of a second operational amplifier 50. At the lowest operating frequency encountered, the RC section is charged to the peak value of the output signal. Diode 46 discharges both shunt capacitors qickly whenever the signal disappears. Foroward converter 21 has an amplification factor which is determined by the magnitude o feedback resistor 47 connected between the output of amplifier 50 and the inverting terminal of amplifier 40. In one particular modification, the gain of this forward AC/DC converter was two. The DC control signal obtained from this circuit is coupled via resistor 22 to the base electodes of the pair of transistors 32 and 35 in the AGC circuit 13.

The signal appearing at thcoutput of amplifier 14 is likewise fed to a so-called backward AC/DC converter 23, which is similar in all respects to forward AC/DC converter 21 except for the magnitude of its feedback resistor corresponding to resistor 47. In the case of converter 23, this feedback resistor has a value such that the gain of this circuit is 2.5 as contracted with the2.0 gain of converter 21. Forward AC/DC converter 21 has the lesser gain bccause it acts in an open loop which tends to over control. Backward converter 3, on the other hand, acts in a closed loop which, as is well known, is a superior mode of controol. Thus, both loops do not share equally in the control of the automatic gain control circuit 13.

Differentiating circuit 17, which is responsible for the nonlinearly decreasing DC control voltage characteristic mentioned hereinbefore, is included in the forward loop because the amplitude of the signal at the output of the integrator increases as the frequency of the square wave is decreased. With the differentiator present, this loop's effectiveness at low frequencies is diminished.

The automatic gain control circuit 13 includes an input transistor 30 having a pair of transistors 31 and 32 in its collector circuit. The output of integrator 12 is coupled to the base electrode of transistor 30. A similar series arrangment of transistors 34, 35 and 36 is also connected across the supply voltage terminals, and the signals appearing across load resistors 33 and 37 are fed to an operational amplifier 38. The output of this amplifier is fed to amplifier 14 and back to a second operational amplifier 39 whose output in turn is applied to the base electrode of transistor 34.

In the automatic gain control circuit 13, transistors 30 and 37 perform as current sources that are modulated by the input signal. Their collector currents are steered through transistors 31 and 36 to the load resistors 33 and 37 or through transistors 32 or 35, bypassing these resistors, depending on the voltage conditions at their base electrodes.

In the operation of the overall system, when the output of integrator 12 decreases, for example, both forward and backward AC/DC converters 21 and 23 operate in the same manner, that is, with less AC input signals available at the inputs of these converters, less DC output voltage is mixed in resistors 22 and 24 and fed to t he automatic gain control circuit 13. With less DC control voltage applied to circuit 13, less attenuation is present in the signal processing circuit between integrator 12 and amplifier 14 and, consequently, a signal of increased amplitude appears at the input of driver 15 and at sine wave shaper 16. In this way, the input to shaper 16 is maintained constant despite fluctuations or variations in signal level at the output of integrator 12.

What is claimed is:

1. A wave shaping circuit, comprising in combination:
   a source of square waves of variable frequency;
   means for integrating said square waves thereby to develop corresponding triangular waves.
   an amplifier having an automatic gain control circuit;
   means for coupling said triangular waves to the input of said amplifier;
   means for controlling the operation of the automatic gain control circuit of said amplifier in response to amplitude variations both in the triangular waves produced by said means for integrating said square waves and in the triangular waves present at the output of said amplifier so as to minimize any such changes in said last-mentioned triangular waves as the frequency of the square waves is varied;
   a sine wave shaper for converting triangular waves to sine waves; and
   means for feeding the output of said amplifier to the input of said sine wave shaper thereby to develop at the output thereof sine waves having a high degree of purity and amplitude uniformity.

2. A square wave to sine wave shaping circuit, comprising in combination
   a source of square waves of variable frequency;
   an integrator having an input and output circuit;
   means for coupling said square wave source to the input circuit of said integrator thereby to develop corresponding triangular waves at the output circuit thereof;
   an amplifier having an automatic gain control circuit associated therewith;
   means for coupling the triangular waves developed at the output circuit of said integrator to the input of said amplifier;
   means responsive to the triangular waves present both at the output circuit of said integrator circuit and the output of said amplifier for producing a DC control signal whose magnitude varies in response to amplitude changes in these triangular waves; and
   means for applying said DC control signal to said automatic gain control circuit such that the gain of said amplifier changes by an amount and in a direction such as to maintain the amplitude of the triangular waves in the output circuit of said amplifier constant as the frequency of said square waves changes;
   a sine wave shaper for converting triangular waves to sine waves;
   means for coupling the output of said amplifier to the input of said sine wave shaper whereby sine waves of high purity and constant amplitude are generated in the output circuit of said sine wave shaper.

3. A square wave to sine wave shaping circuit which produces a sine wave having a high degree of purity and a constant amplitude, comprising in combination
   a source of square waves of variable frequency;
   an integrator having an input and output circuit;
   means for coupling said square wave source to the input circuit of said integrator so as to develop corresponding triangular waves at the output circuit thereof;
   an amplifier having an automatic gain control circuit;

means for coupling the triangular waves developed in the output circuit of said integrator to the input of said amplifier;

means for deriving from the triangular waves present at the output circuit of said integrator a first DC control signal whose amplitude is related to that of the triangular waves from which it is derived;

means for deriving from the triangular waves present at the output of said amplifier a second DC signal whose amplitude is related to that of said last-mentioned triangular waves;

means for combining said first and second DC control signal and for applying the resultant signal to said automatic gain control circuit such that the gain of said amplifier changes in response to variations in the amplitudes of the triangular waves that are present both at the output of said integrator and the output of said amplifier and triangular waves of substantially constant amplitude are thereby producing in the output of said amplifier;

a sine wave shaper for converting triangular waves to sine waves; and means for coupling the output of said amplifier to the input of said sine wave shaper whereby sine waves having a high degree of purity and a constant amplitude are produced in the output circuit thereof.

4. A wave shaping circuit comprising, in combination:

a source of square waves of variable frequency;

an integrator having an input and output circuit;

means for coupling said square wave source to the input circuit of said integrator thereby to develop triangular waves at the output circuit thereof;

an automatic gain control circuit having an input and an output side, said automatic gain control circuit exhibiting an impedance whose magnitude is determined by the amplitude of a DC signal applied to a control point thereof;

means for coupling the triangular waves developed at the output circuit of said integrator to the input side of said automatic gain control circuit.

an amplifier having its input connected to the output side of said automatic gain control circuit;

means for deriving from the triangular waves present at the input side of said automatic gain control circuit a first DC signal whose magnitude is determined by the amplitude of these triangular waves;

means for deriving from the triangular waves present at the output of said amplifier a second DC signal whose magnitude is determined by the amplitude of these last-mentioned triangular waves;

means for combining said first and second DC signals in predetermined proportions and for applying the resultant signal to the control point of said automatic gain control circuit;

a sine wave shaper;

means for coupling the triangular waves appearing at the output of said amplifier to the input of said sine wave shaper whereby sine waves of a high purity content and constant amplitude are produced at the output of said sine wave shaper.

5. A swuare wave to sine wave shaping circuit, comprising in combination a source of square waves of variable frequency;

an integrator having an input and output circuit;

means for coupling said square wave source to the input circuit of said integrator thereby to generate corresponding triangular waves at the output circuit thereof;

an amplifier having an automatic gain control circuit;

means for converting the triangular waves present at the output circuit of said integrator to a first DC signal whose amplitude is determined by that of said triangular waves;

means for amplifying said first DC signal by a first preselected amount;

means for converting the triangular waves present at the output circuit of said amplifier to a second DC signal whose amplitude is determined by that of said last-mentioned triangular waves;

means for amplifying said second DC signal by a second preselected amount which is different than said first preselected amount;

means for combining said first and second amplified DC signals and for coupling the summation signal to said automatic gain control circuit thereby to minimize any amplitude variations in the triangular waves appearing in the output circuit of said amplifier produced by changes in the frequency of said square waves;

a sine wave shaper for converting triangular waves to sine waves; and means for coupling the output circuit of said amplifier to the input of said sine wave shaper thereby to produce in the output circuit thereof sine waves having a high degree of purity and uniform amplitude.

* * * * *